United States Patent
Shigi et al.

(10) Patent No.: US 6,506,982 B1
(45) Date of Patent: Jan. 14, 2003

(54) MULTI-LAYER WIRING SUBSTRATE AND MANUFACTURING METHOD THEREOF

(75) Inventors: Hidetaka Shigi, Hakone (JP); Naoya Kitamura, Yokohama (JP); Masashi Nishiki, Yokohama (JP); Tetsuya Yamazaki, Fujisawa (JP); Takehiko Hasebe, Yokohama (JP); Masayuki Kyooi, Yokohama (JP); Yukio Maeda, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/501,596

(22) Filed: Feb. 10, 2000

(30) Foreign Application Priority Data

Jun. 17, 1999 (JP) ............................................ 11-170597

(51) Int. Cl.⁷ ................................................ H05K 1/11
(52) U.S. Cl. ....................... 174/264; 361/792; 174/260; 174/262
(58) Field of Search ................................ 174/250–258, 174/260, 262, 263, 264, 265, 266; 361/792, 793, 794, 795

(56) References Cited

U.S. PATENT DOCUMENTS

| 4,882,839 A | * | 11/1989 | Okada ........................... 29/853 |
| 5,078,831 A | * | 1/1992 | Miyazaki et al. ............ 156/630 |
| 5,534,666 A | * | 7/1996 | Ishida ......................... 174/260 |
| 5,768,108 A | * | 6/1998 | Miura et al. ................. 361/792 |
| 6,143,116 A | * | 11/2000 | Hayashi et al. .............. 156/233 |
| 6,214,445 B1 | * | 4/2001 | Kanbe et al. ................ 428/209 |

FOREIGN PATENT DOCUMENTS

JP          4148590         5/1992

* cited by examiner

*Primary Examiner*—Kamand Cuneo
*Assistant Examiner*—Jose' H. Alcalá
(74) *Attorney, Agent, or Firm*—Antonelli, Terry, Stout & Kraus, LLP

(57) ABSTRACT

A multi-layer wiring substrate capable of high density packaging, and a method of manufacturing the same, in which a carrier substrate, in which through holes can be easily formed in high density corresponding substantially to a pitch of connecting terminals in a semiconductor chip, and build-up layers are formed on the substrate with the application of a conventional build-up technique. When the build-up technique for repeatedly forming insulating layers and wiring layers on a carrier substrate is used to manufacture a multi-layer wiring substrate, the carrier substrate is formed in the following manner. First, an insulating resin layer is formed in a copper foil, in which a plurality of first windows are regularly provided, to cover the copper foil, and the resin layer fills the interior of the windows. Subsequently, second windows of a particular shape are provided in regions of layers of the insulating resin filled in the windows, and independent conducting paths are formed through the second windows to extend from front sides of the second windows to back sides thereof. The conducting paths are formed radially to be spaced a substantially equal distance from centers of the respective second windows.

11 Claims, 5 Drawing Sheets

MULTI-LAYER WIRING SUBSTRATE AND MANUFACTURING METHOD THEREOF

BACKGROUND OF THE INVENTION

The present invention relates to a multi-layer wiring substrate, which has a build-up laminated body configured by repeatedly laminating insulating layers and wiring layers alternately on a carrier substrate, and a method for manufacturing the substrate, and, in particular, to a multi-layer wiring substrate, which has a feature in the configuration of a carrier substrate for realizing higher density, and a method for manufacturing the substrate.

Miniaturization of electronic equipments is rapidly promoted, and a technical outlook has been presented, in which the thin film technology is made use of to realize 0.25 mm pitch with respect to packaging of semiconductors, as described in "Nikkei Micro Device" (August 1998, pp. 66 to 71).

A wiring substrate to be incorporated into such package includes a known multi-layer wiring substrate having a build-up laminated body. Such multi-layer wiring substrate having a build-up laminated body is herein referred to as a build-up substrate.

In basic technology for build-up substrates is, as disclosed in, for example, Japanese Patent No. 2739726 (Japanese Patent Unexamined Publication No.4-148590), high density packaging is realized by using the fine processing technique of a build-up layer, in which insulating layers and wiring layers are stacked one by one alternately on front and back surfaces of a printed wiring board.

However, at the stage when such technique presented itself, a core wiring substrate (to be a carrier substrate) and front and rear build-up layers are connected by forming holes by means of drilling and applying plating to such holes, which gives rise to such problems that density of the entire substrate is limited by accuracy of the drilling, and the holes restricts a wiring area.

Among those problems, restriction on the wiring area is solved by the development of that technique, in which through holes are formed in a printed substrate (that is, a carrier substrate and also called a core substrate) being a core, the through holes are filled with a resin, and then the build-up technique is applied. A structure of a semiconductor device, in which a semiconductor chip (LSI) is mounted on a multi-layer wiring substrate obtained by the build-up technique, is shown in FIG. 1.

As shown in FIG. 1, a pitch "b" of through holes 12 in a core substrate 10, formed by drilling is normally larger than a pitch "a" of terminals (solder connection) 2 on an LSI indicated by the reference numeral 1. Therefore, when wiring layers 16 on the core substrate 10 are to be connected to wiring layers 13 on a build-up layer 11, wiring from the LSI terminals 2 to the through holes 12 in the core substrate 10 is necessarily formed by using wiring layers 13 in the build-up layer 11, in which insulation layers 15 and the wiring layers 13 are stacked alternately, build-up layer vias 14, and lands 16a about opening portions of the through holes 12, and thus direct connection between the LSI terminals 2 and the through holes 12 has in no way been taken into consideration.

The problem of restriction on density due to drilling has been successfully solved by the advent of the so-called coreless technique, in which the use of a printed board for a core is abandoned, and wiring sheets having fine front-to-back conductive passages formed with the laser processing and the like are stacked one another.

However, in addition to the problem such as handling required for suppressing deformation of sheets, such coreless structure offers a problem in losing an advantage of the conventional build-up technique capable of advancing most processing steps simultaneously on front and back parts.

SUMMARY OF THE INVENTION

Accordingly, an object of the present invention is to solve the problems of the abovedescribed conventional build-up substrate, and to provide a multi-layer wiring substrate, which realizes a carrier substrate enabled to be formed with through holes in high density, and applies the conventional build-up technique to the carrier substrate to form build-up layers thereon for high density packaging, and a manufacturing method thereof.

Therefore, to attain the above-described purposes, the inventors of the present application have investigated the functions of through holes on a core substrate in a conventional build-up substrate shown in FIG. 1. As a result, one of the functions is the provision of electric connection in a power source, grounding, signals and so on, etc. between build-up layers 11, which are formed on front and back sides of the core substrate . Another function is the provision of connection to signal layers in the core substrate 10 although limited to the case where multi-layer substrates are used.

Since the core substrate 10 is normally low in wiring density as compared with that in the build-up layers 11, only the connecting function in connection with the front and back sides of the core substrate is necessary provided that the core substrate 10 be not provided with any wiring function. Hereupon, a carrier substrate will be demanded, in which through holes are arranged in high density with a desired dimensional accuracy.

FIG. 2 shows a structural model of an ideal build-up substrate 20 having a terminal pitch "a" for a LSI, and so a pitch "b" of conductors 17 connecting front and back sides of the core substrate 20 to each other must be naturally made fine to a level of the terminal pitch "a" of the LSI (the pitch a=b). It is estimated that such pitch will be made fine to 0.25 mm around the year 2002 to 2003, and if this is not realized, rewiring from an LSI to a core conductor will be needed as in the prior art. The reference signs 1, 2, 11, 13, 13a, and 15 refer to the same elements shown in FIG. 1, and therefore need not describe herein.

However, it is not necessary for through holes to be arranged in the same pitch on the level of the carrier substrate, and the pitch of the through holes can be preferably converted to the pitch of the build-up layer or of terminals of the semiconductor package, so it sufficing that the through holes per unit area can be secured in quantity as required. In view of the above, the present invention proposes a structure, which premises that a plurality of through holes are simultaneously formed in a small area.

The inventors of the present application have performed various experiments on the basis of the above investigation result to obtain an important knowledge that can attain the object of the invention as described below in details.

More specifically, a plurality of windows are provided in a foil of copper, a measure such as the blacking treatment, Ni plating and the like is used to form an irregular surface on the copper surface, and an insulating resin layer is formed closely on the surface, so that the windows are filled with the resin. The insulating resin includes resins, such as a solder resist of epoxy resin group or polyimide, which are conventionally used as an interlayer insulating film for a multi-layer wiring structure.

With such construction, it is possible to set a coefficient of thermal expansion of the entire structure close to that of the copper foil, and so to reduce a load in the thermal process. of course, a metal foil other than copper may be used in order to obtain a line expansion coefficient other than that of copper in applications of semiconductor packages and so on. This kind of resin-coated copper foil with windows is disclosed in, for example, Japanese Patent Unexamined Publication No. 6-268381, which provides a process for laminating the copper foil but does not suggest lines, in which the copper foil is used for a carrier substrate in the build-up technique.

Then, the inventors of the present application have investigated a measure of forming a plurality of through holes in window portions of the copper-resin complex structure, which has a handling quality. While the carbon dioxide laser offers a large processing speed up to 50,000 nm, the high-frequency YAG laser having an ultraviolet wavelength may be more useful in a smaller range, but is disadvantageous in a small processing speed.

Such small processing speed is attributed to a limitation of a resin in ultraviolet transmittance, and is hard to dramatically increase in output. Hereupon, the processing speed can be increased by reforming a laser beam into a multi-beam by optical means, and simultaneously forming a plurality of holes.

In configuring such an optical system for reforming into a multi-beam, the processing in a narrow region is necessarily required. The present invention realizes the processing by concentrating the hole formation processing at the window portions of a copper foil. After the formation of holes, a plurality of through holes at the window portions can be formed by applying a catalyst and performing copper plating after the desmire treatment of resin (one for removing processed residues) or the coarsening treatment is carried out. A pitch of these plurality of through holes should not be determined by the technology related to the hole processing but should be determined by the inter-layer registering technology.

In addition, a similar function can be achieved by the following measures. Such measures is the same as described above with respect to the procedure, by which the resin coated copper foil with windows (open window sheet) is formed, but subsequently a second window having a particular shape is formed in the window filled with the resin.

More specifically, the second window is formed to have a plurality of irregular portions, which are disposed radially, and comprise mountains and valleys extending adjacent to each other on wall surfaces in the insulating resin layer region, which is disposed in the window filled with the resin, to be spaced a substantially equal distance from the center point of the window. Such technique includes punch working with the use of, for example, molds. Portions to processed are disposed only within a region of a resin layer, which is filled in the window, and are enabled enough to be subjected to punch working, and a contrivance in the process, in which the whole portions are heated, can be applied to provide an increase in throughput. However, if the window is made fine, laser beam processing is desirable.

Subsequently, the coarsening treatment is performed on the surface, and application of a catalyst and copper plating is effected to cover the entire surface with copper. Thereafter, a plurality of copper lines along the internal wall of the punched hole can be obtained by using drilling to remove only the central portion of the second window.

Thereafter, the interior of the second window is again filled with a resin in a similar method and the copper portions on the front and back surfaces are subjected to etching process into a desired shape to enable forming a plurality of conductive paths for one copper foil window. If filling in the holes in the subsequent process is unnecessary, such filling is not needed provided that a liquid resist is used for separating the patterns on the front and back surfaces. The resist is preferably of a positive type.

While drilling is used in this example to remove a portion (convex portion) of the copper plating formed inside the second window, a desired structure can be obtained as by removing the catalyst at the unnecessary portions in a similar manner after the application of the catalyst. In a simplest way, it is suitable to shave off the resin in the convex portions by means of drilling after the application of the catalyst or to polish the surface thereof so as to remove the catalyst in the portions.

Also, a resin-coated copper foil with a window (a copper foil having a window filled with the resin) may be a laminated structure, and it is apparent that the use of two sheets of copper foils with a material of high dielectric constant interposed therebetween can easily form a capacitor. In this case, if a region where the conductive paths (through holes) connecting the front and back surfaces are formed is separated from the copper foil in a planar manner, the total area required for making the through holes clear of the power source can be made small to contribute to enhancement of the capacity of the capacitor.

The multi-layer wiring substrate of the invention is formed with a wiring structure, which is composed of a build-up laminated body formed by repeatedly stacking insulation layers and wiring layers on a carrier substrate. The carrier substrate comprises a copper foil provided with a plurality of windows in regular configuration; an insulating resin layer, which is filled in the windows of the copper foil and coats the copper foil; and a plurality of independent conductive paths, which are provided in regions of the insulating resin layer filled in the windows of the copper foil, and extend from a front side of the substrate to a back side thereof.

Desirably, the plurality of independent conductive paths, which are provided in regions of the insulating resin layer filled in the windows of the copper foil, and extend from a front side of the substrate to a back side thereof, are provided radially to be spaced a substantially equal distance from centers of the respective second windows.

Preferably, the copper foil, which is provided with a plurality of windows in regular configuration and constitutes the carrier substrate, comprises a laminated body, in which plural layers of copper foil stick to one another with insulating materials interposed there-between, and the laminated body, in which plural layers of copper foil stick to one another with insulating materials interposed therebetween, comprises a laminated body, in which an insulating material mixed with a high dielectric filler as the insulating materials and having a dielectric constant of 10 or more as a whole is used to stick the plural layers of copper foil.

A method of manufacturing a multi-layer wiring substrate including a wiring structure, which is composed of a build-up laminated body formed by repeatedly stacking insulation layers and wiring layers on a carrier substrate. The carrier substrate is formed by the steps of forming a plurality of windows in a copper foil in regular configuration; forming an insulating resin layer, which is filled in the windows of the copper foil and coats the copper foil with a uniform thickness; and forming a plurality of independent conductive paths, which are provided in regions of the insulating resin layer filled in the windows of the copper foil, and extend from a front side of the substrate to a back side thereof.

In one aspect of the invention, the plurality of independent conductive paths, which are provided in regions of the insulating resin layer filled in the windows of the copper foil, and extend from a front side of the substrate to a back side thereof, are provided radially to be spaced a substantially equal distance from centers of the respective second windows.

Preferably, the copper foil, which is provided with a plurality of windows in regular configuration and constitutes the carrier substrate, comprises a laminated body, in which plural layers of copper foil stick to one another with insulating materials interposed there-between, and the laminated body, in which plural layers of copper foil stick to one another with insulating materials interposed therebetween, comprises a laminated body, in which an insulating material mixed with a high dielectric filler as the insulating materials and having a dielectric constant of 10 or more as a whole is used to stick the plural layers of copper foil.

In a further aspect of the invention, preferably, the step of forming a plurality of independent conductive paths, which are provided in regions of the insulating resin layer filled in the windows of the copper foil, and extend from a front side of the substrate to a back side thereof, comprises the steps of (1) providing a plurality of through openings as second windows in regions of the insulating resin layer filled in the windows of the copper foil; (2) applying copper plating on the insulating resin layer, which fills the second windows and covers the copper foil; and (3) selectively applying etching on the copper plating, which is formed on the insulating resin layer, to form lands on at least opening portions of the second windows.

More preferably, the step of forming a plurality of independent conductive paths, which are provided in regions of the insulating resin layer filled in the windows of the copper foil, and extend from a front side of the substrate to a back side thereof, comprises the steps of (1) forming second windows in regions of the insulating resin layer filled in the windows of the copper foil, the windows having a plurality of convex and concave portions, which portions are disposed radially and in which mountains and valleys are cyclically present in the wall surfaces with the mountains and valleys adjacent to each other to be spaced a substantially equal distance from centers of the windows; (2) applying copper plating on the insulating resin layer, which covers inner walls of the second windows and the copper foil; (3) mechanically polishing the inner walls of the second windows to selectively remove the copper plating on the convex portions to leave the copper plating on the concave portions; and (4) selectively applying etching on at least the copper plating around the opening edges of the second windows among the copper plating formed on the insulating resin layer to form lands connected to the copper plating in the concave portions in the second windows.

Further, the step (2) of applying copper plating on the insulating resin layer, which covers inner walls of the second windows and the copper foil, comprises the step of applying a plating catalyst by chemical copper plating on the concave portions of the second windows without applying copper plating on the convex portions, and wherein the step (3) of mechanically polishing the inner walls of the second windows to selectively remove the copper plating on the convex portions to leave the copper plating on the concave portions is dispensed with.

Also, the step of forming second windows in regions of the insulating resin layer filled in the windows of the copper foil, comprises laser beam processing.

The laser beam processing for forming the second windows comprises using triple harmonic waves and quadruple harmonic waves of the YAG laser and performing projection irradiation of an aperture composed of a plurality of independent figures, whereby the processing for formation of a plurality of holes is performed at a time.

A pretreatment for the step of copper plating comprises coarsening surfaces of the insulation resin layer including the side walls of the second windows and subsequently performing chemical copper plating after a plating catalyst is applied.

When a semiconductor chip is mounted on the multi-layer wiring substrate, it is possible to realize a semiconductor device, which is packaged in high density.

DESCRIPTION OF THE PREFERRED EMBODIMENTS

Embodiments of the invention will be concretely described hereinbelow with reference to the drawings.

(First Embodiment)

Figure 3:
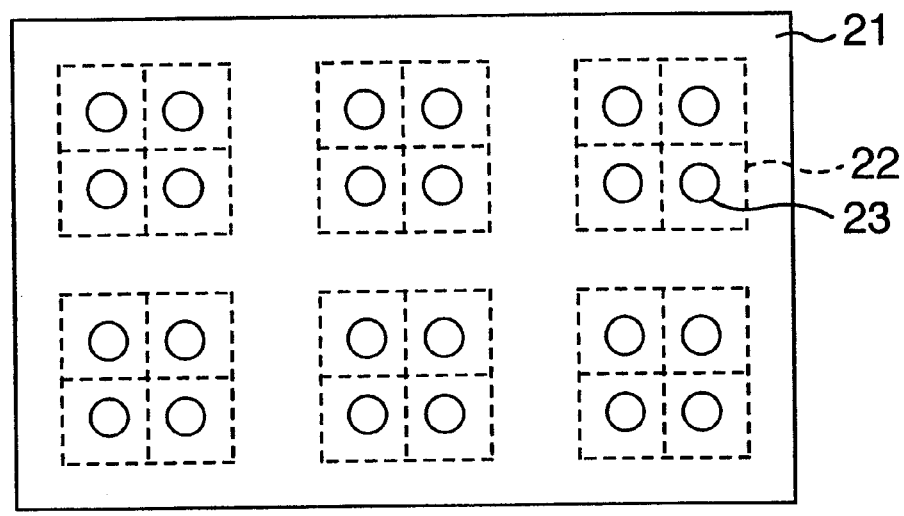
FIG. 3 is a plane view showing a carrier substrate, which constitutes an embodiment of the present invention.

FIG. 3 is a schematic plane view showing a carrier substrate, which constitutes an essential portion of a multi wiring substrate according to the invention.

As shown in the figure, a carrier substrate 20 is formed by first coating a copper foil 21, in which a plurality of square-shaped windows (first windows) 22 having sides of 0.2 mm in length are formed at the same pitch of 0.5 mm, with an epoxy-based insulating resin as an insulating resin, filling interiors of the windows 22 with the insulating resin, and covering the entire surface of the copper foil with the resin. The first windows 22 filled with a resin of a composite sheet composed of the copper foil and the resin are formed with independent conductor paths 23, which connect four front and back portions, respectively. The independent conductor paths 23 comprise through holes of 0.03 mm in diameter and the respective conductor paths 23 are disposed at a pitch of 0.1 mm.

The first windows 22 shown in FIG. 3 are formed by punching the copper foil 21 by means of square punches. And the four conducting paths 23 formed in regions of the insulating resin in the first windows 22 are formed in the following manner.

First, four of the second windows are simultaneously formed by YAG laser processing. The YAG laser beam normally has a diameter of around 2 mm, and can be converted into multi-beam with the use of optical contrivance, that is, simply an aperture although being reduced in total output. Accordingly, four holes can be simultaneously formed in the filling resin layer of the first windows 22.

The subsequent steps comprise coarsening the resin layer surfaces so as to closely adhere the copper-plated layer to the resin layer, applying a catalyst, performing chemical copper plating on the surfaces, and patterning the copper-plated layer of the substrate surface to form lands in opening portions of the second windows, which electrically separates the respective conductors 23 formed in the second windows to make the same serve as independent conducting paths. With the independent conducting paths 23, it is possible to form the carrier substrate 20 having the front-to-back extending conductors 17 of practically high density as schematically shown in FIG. 2.

Figure 1:
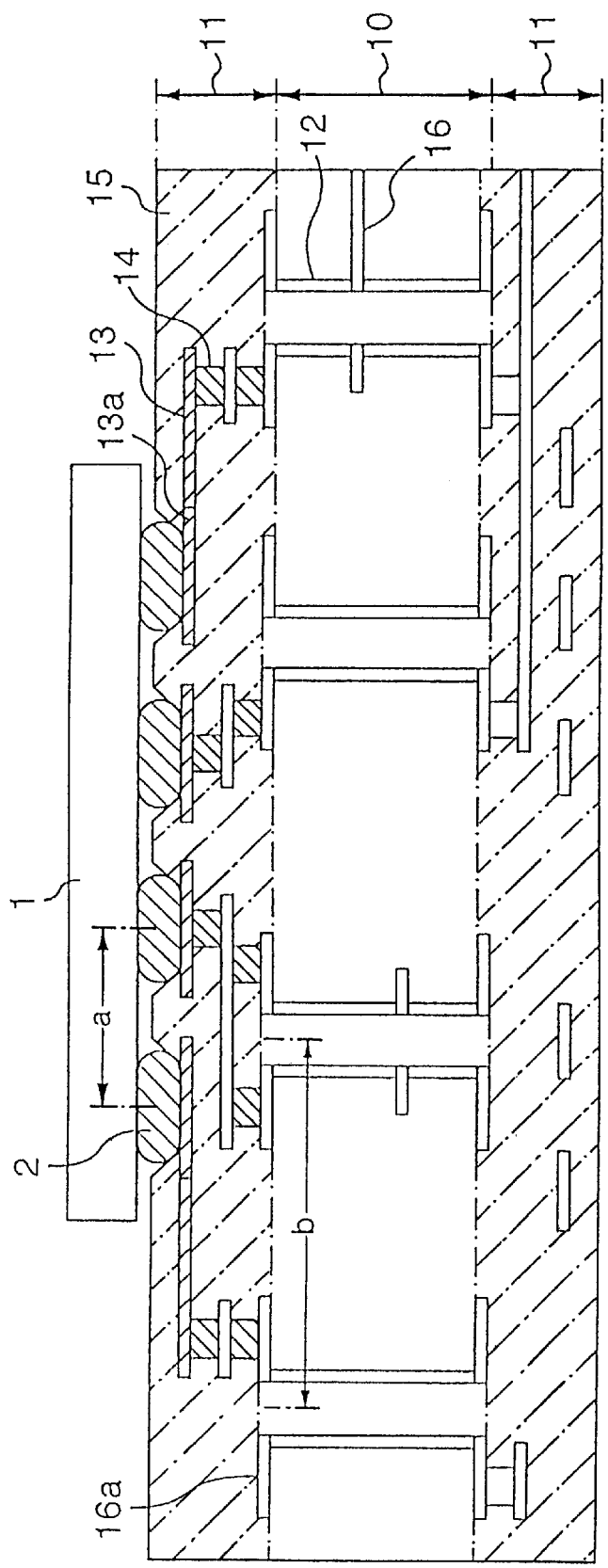
FIG. 1 is a cross sectional view showing a conventional build-up substrate having a core comprising a substrate, of which holes formed by drilling are filled.
Figure 2:
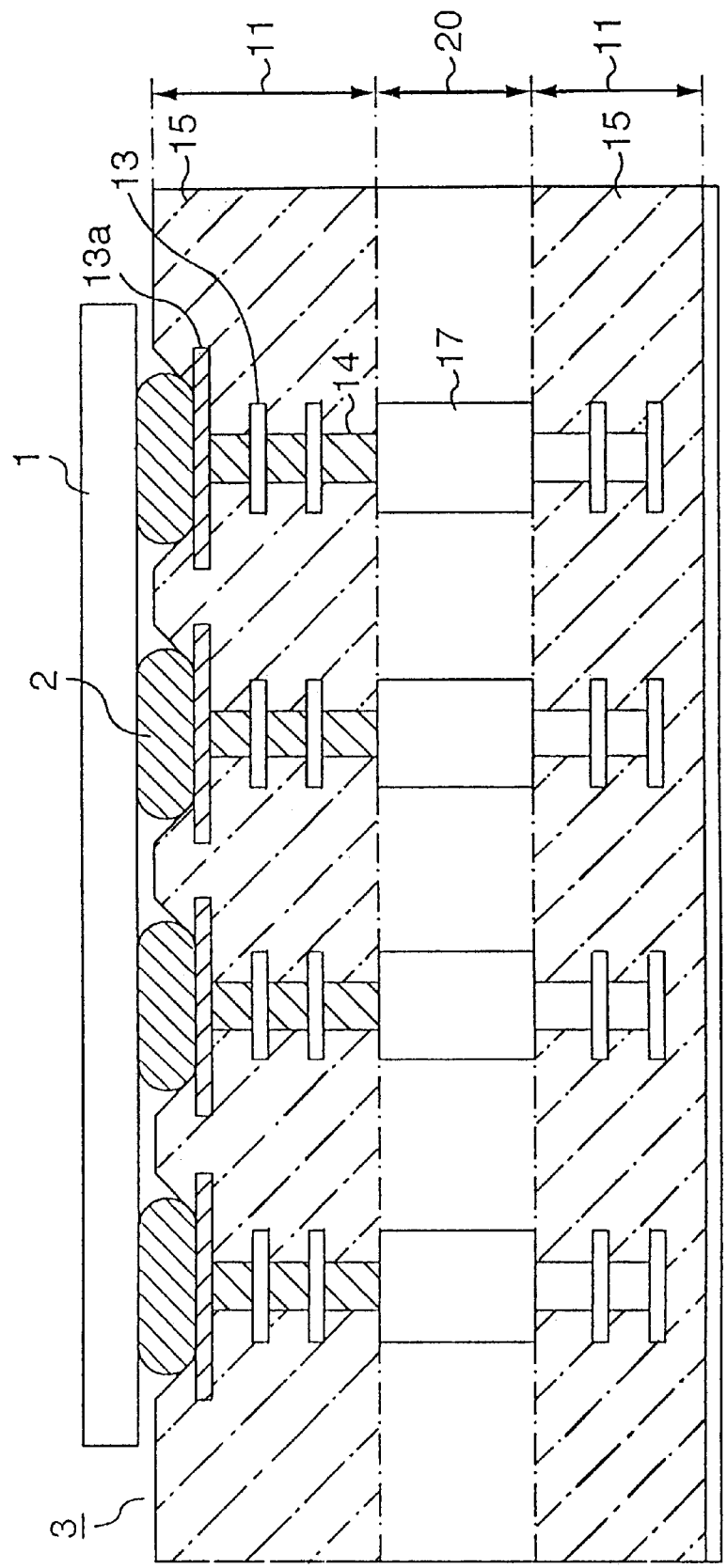
FIG. 2 is a cross sectional view showing a packaged substrate, in which a pitch of through holes is made fine on the order of a terminal pitch of an LSI.

A build-up layer 20 is formed on both sides of the thus obtained carrier substrate 20 by means of the known build-up technique for forming the insulating layers and the wiring layers alternately, and the multi-layer wiring substrate is thus manufactured, which has a construction schematically shown in FIG. 2 and is capable of high density packaging fit for the purpose of the invention. Moreover, a semiconductor chip is mounted on the multi wiring substrate, and finally a semiconductor device of multi chip type is realized.

Incidentally, if the copper foil sheet 21 for formation of the above-described first windows 22 is used as a sandwich structure with the insulating resin layer (dielectric material) interposed between two sheets of copper foil, the two sheets of copper foil, respectively, can be patterned to serve as wired circuits, and if the upper and lower copper foils thus patterned are connected as, for example, electrodes to a separate power sources in a circuit arrangement, capacitors can be formed as well.

In this case, as compared with the case where clearances for the copper foil are produced every front-to-back extending conductors (through holes), a large capacity can be obtained since an area of the remaining copper foil can be made large if clearances (windows in the copper foil) are provided for a plurality of conductors provided that the same practical through hole pitch is formed.

(Second Embodiment)

Figure 4:
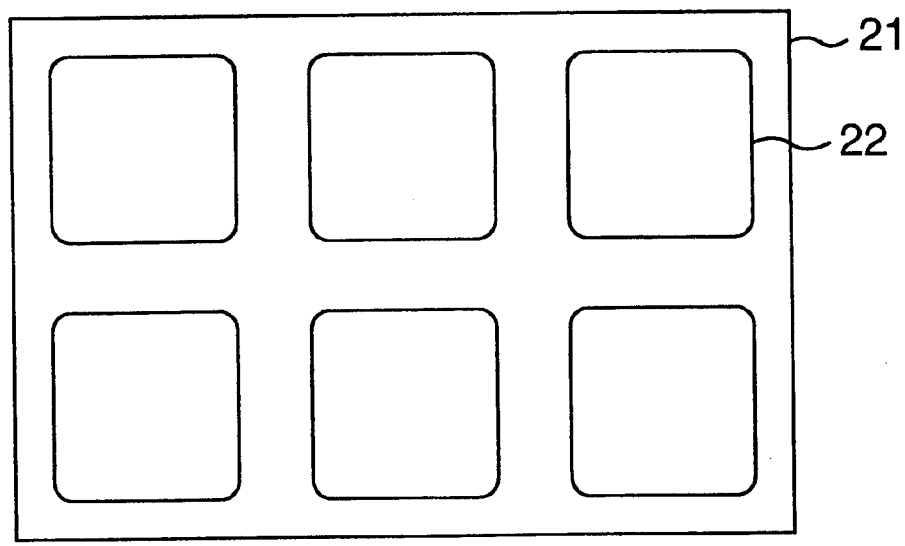
FIG. 4 is a plane view showing a copper foil formed with first windows and illustrating the manufacturing step, in which a carrier substrate according to another embodiment of the present invention.

FIGS. 4 though 8 are views showing the manufacturing steps of a carrier substrate 20 according to another embodiment of the invention, and the respective manufacturing steps will be described hereinbelow with reference to the drawings.

First, as shown in the plan view of FIG. 4, punching is used to form a plurality of first windows 22 in a copper foil 21 at a predetermined pitch in the same manner as in the first embodiment. In this embodiment, a dimension of the windows is set to form a square having sides of 0.25 mm in length on the premise that the carbon dioxide laser is used for working of the windows.

Figure 5A:
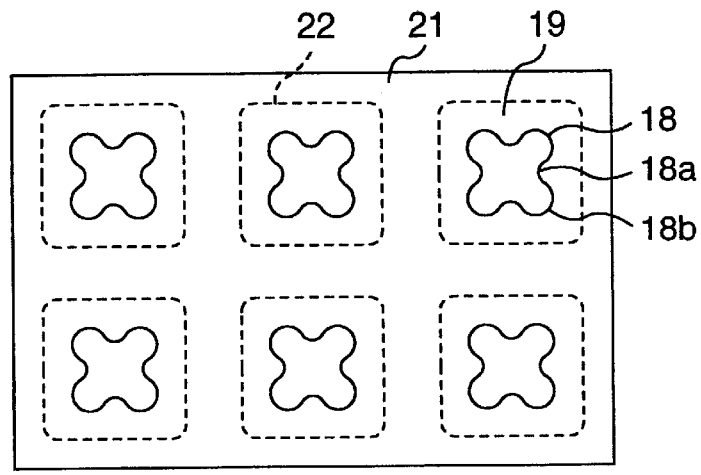
FIGS. 5A through 5C are views showing the steps, in which the copper foil sheet with the first windows are coated with an insulating resin similarly, second windows having a particular shape are formed in a region of the insulating resin, which is filled in the windows.

Subsequently, as shown in FIG. 5A, surfaces of the copper foil 21 and wall surfaces of the first windows 22 are subjected to pretreatment for improvement in close adherence with an insulating resin being formed later, as by such measures as blackening reduction treatment or needle-shaped plating. These surfaces are further coated with the insulating resin, at which the windows 22 in the copper foil 21 are filled with the insulating resin, so that a flat surface is formed as a whole. It is desirable that the insulating resin used at that time be adjusted by a filler and the like with respect to a coefficient of thermal expansion and the heat resistance and so on, so as to meet properties required for a carrier.

Subsequently, second windows 18 are formed in a region 19 of the resin layer filled in the windows 22, as shown in the figure. The second windows are formed with a plurality of irregular portions in a radial configuration, the portions comprising mountains 18a and valleys 18b, which are disposed periodically adjacent to one another on the wall surface to be spaced a substantially equal distance from the center of the windows. In the embodiment, the carbon dioxide laser processing using an aperture is used to form the second window 18 having a punching pattern with four convex and concave portions therearound. However, such convex and concave portions are not limited to four, and can be formed in plural numbers corresponding to the number of conducting paths required in a range of possible formation. This time, an aperture is formed, which has a distance of 0.18 mm between the opposite concave portions and a distance of 0.08 mm between the opposite convex portions, and the carbon dioxide laser is used for the processing.

Figure 5B:
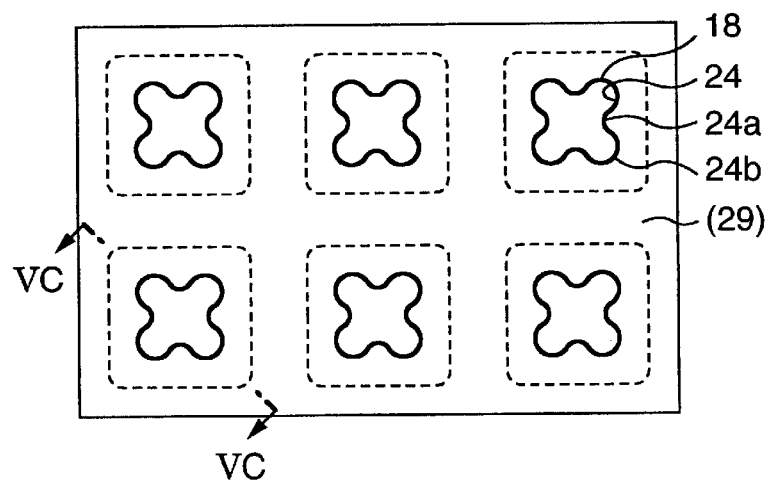

Subsequently, as shown in FIG. 5B, the surfaces of the insulating resin layer are coarsened, the plating catalyst is applied thereto, and a chemical copper plating 24 is carried out. While the figure shows that the chemical copper plating 24 appears to be formed only on the wall surfaces of the second windows 18, the plating is actually formed over the entire substrate surfaces (the copper plating layer on the substrate surface is omitted in the figure). In addition, while the chemical copper is described as the plating on the surfaces, a desired configuration can be obtained by applying thin flash plating to the surface and then applying electric plating with the use of the flash plating as an electrode,.

Figure 5C:
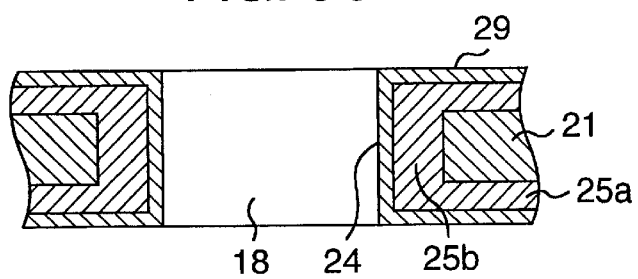

FIG. 5C is an enlarged cross sectional view taken along the line VC—VC in FIG. 5B, and the reference numeral 21 designates a copper foil, 25a an insulating resin layer covering the substrate, 25b a portion of the insulating resin layer filled in the first windows 22, a copper plating layer 24 formed on the wall surfaces of the second windows 18, and a copper plating layer 24 on the substrate.

Figure 6:
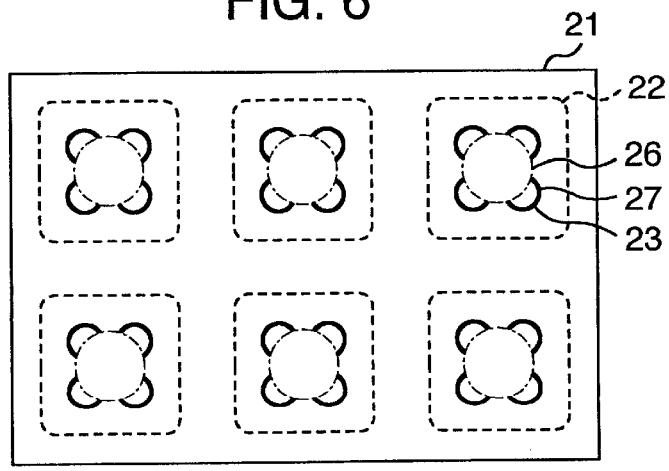
FIG. 6 is a plane view showing the step, in which copper plated layers formed on the wall surface of the second windows are divided into four portions.

FIG. 6 shows a state, in which central portions of the second windows 18 is shaved off by drilling and the copper plating layer 24a on the convex portions 18a is removed. The reference numeral 26 designates an outer diameter in the drilling. By the above procedure, non-metallized portions (the insulating resin layer exposed) extending from front sides of the second windows to back sides thereof can be formed on the interior walls of the second windows 18 and four conducting paths 27 (concave portions 24b) are can be formed, which are divided by the exposed insulating resin layer.

Figure 7A:
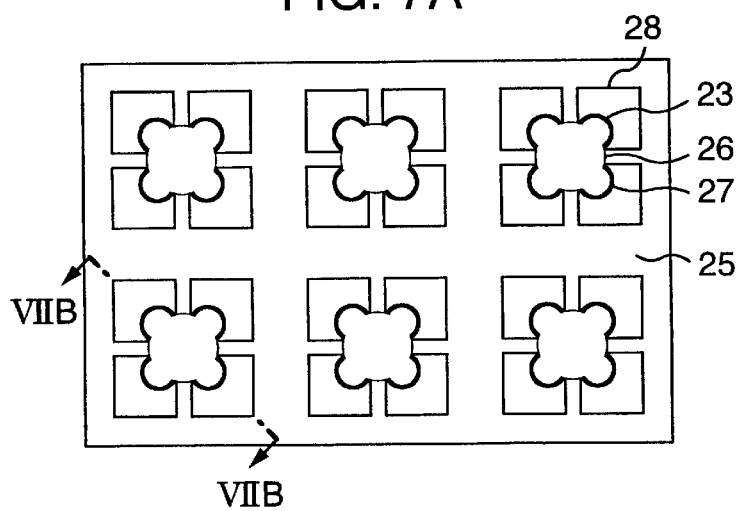
FIGS. 7A and 7B are plane views showing the steps, in which the copper plated layers on the front and back surfaces of the substrate are selectively subjected to etching to be patterned to form lands at opening portions of the second windows to form independent conductive paths extending through the front and back surfaces divided into four portions.

Thereafter, as shown in FIG. 7A, the copper plating layers 29 on the front and back surfaces of the substrate are patterned by the subtract (etching) processing, and lands 28, respectively, connected with the four conducting paths 27 can be formed around the opening portion of the substrate to form independent conductors 27, which extend through the substrate from the front side thereof to the back side thereof.

Figure 7B:
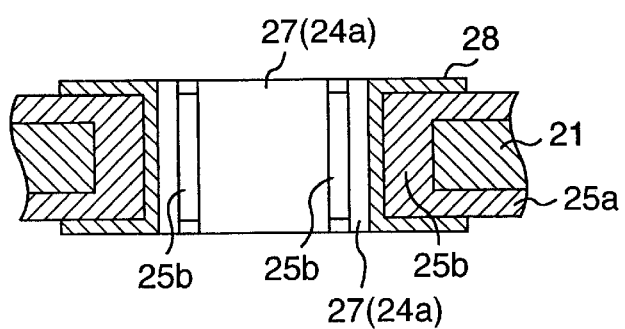

FIG. 7B is an enlarged cross sectional view taken along the line VIIB—VIIB in FIG. 7A.

As described above, FIG. 7A shows the example, in which the four conducting paths 27 are provided for the first window 22, which are formed in the copper foil 21 by the series of procedures. In using the etching processing to pattern the copper plating layer 29 on the substrate surface, the resin may be used to provide for filling, and resist may be formed after buff-polishing or the like is used to remove the resin attached to the conductor portions again in the case where the second windows 18 interferes with the formation of resist masking.

In the example shown in FIGS. 5A though 5C, the second windows 18 are formed, copper plating is applied on the entire side walls of the windows, and the convex portions 24a on the window wall surfaces are shaved off by drilling to separate the conductors 24b in the concave portions, thereby providing for four conducting paths 27. However, the catalyst on unwanted portions can be removed after the application of the catalyst. In a most simple way, drilling may be used to remove the catalyst in the convex portions 24a as well as the underlying insulating resin layer, and thereafter chemical plating may be applied.

Also, second independent conducting paths can be formed, and the through holes can be arranged in high density by forming the independent conducting paths 27 in the second windows 18 in FIGS. 7A and 7B, then filling the remaining holes with the insulating resin again to form the second filling resin layer, and repeating the steps of FIG. 5A through FIG. 7B in the region of the filled resin layer.

A build-up layer 20 is formed on both sides of the carrier substrate 20 thus obtained, by means of the known build-up technique, by which the insulating layers and the wiring layers are formed alternately, and the multi-layer wiring substrate is manufactured, which is constructed in the manner schematically shown in FIG. 2 and is capable of high density packaging, to which the invention is directed. Moreover, a semiconductor chip is mounted on the multi wiring substrate, and finally a semiconductor device of multi chip type is realized.

With the carrier substrate according to the invention, the second windows 18 having a particular shape are formed in the respective first windows 22 filled with the insulating resin to provide a plurality of through holes in the narrow area, and pins of different properties such as signal, GRD, and power source are allotted to the respective through holes, so that control of impedance of signal through holes, which has been impossible with printed substrates drilled is made possible. In addition, a power source and a GRD are disposed proximate to each other, which enables making use of mutual inductance and so is effective in enabling reducing apparent self-inductance.

As describe above in details, the invention can attain the intended object. That is, the multi-layer wiring substrate according to the invention has a feature in that a plurality of the first windows are provided in the copper foil at a predetermined pitch, these windows are filled with the insulating resin, the surfaces of the copper foil are covered with the insulating resin in flat manner, and the structure, in which a plurality of independent conducting paths extending from the front side to the back surfaces in the filled resin region in the respective first windows filled with the insulating resin are formed, is used as the carrier substrate. With these independent conducting paths, the fine processing technique limited to such small windows can be used, which affords an exceedingly inexpensive manufacturing cost as compared with the formation of through conductors, which extend from the front side of the substrate to the back side thereof, at an equal pitch.

What is claimed is:

1. A multi-layer wiring substrate formed with a wiring structure, which is composed of a build-up laminated body formed by repeatedly stacking insulation layers and wiring layers on a carrier substrate, said carrier substrate comprising:

a copper foil provided with at least a window;

an insulating resin layer, which fills in the window of said copper foil and coats the copper foil; and a plurality of independent conductive paths, which are provided in regions of the insulating resin layer filled in the window of said copper foil, and which extend from a front side of the multi-layer wiring substrate to a back side thereof.

2. The multi-layer wiring substrate according to claim 1, wherein the plurality of independent conductive paths are provided radially to be spaced a substantially equal distance from a center of the window.

3. The multi-layer wiring substrate according to claim 1, wherein the copper foil, which is provided with a plurality of windows, comprises a laminated body, in which plural layers of copper foil stick to one another with insulating materials interposed therebetween.

4. The multi-layer wiring substrate according to claim 3, wherein said insulating materials contain a high dielectric filler and exhibit a dielectric constant of 10 or more as a whole used to stick said plural layers of copper foil.

5. A semiconductor device comprising a semiconductor chip mounted on the multi-layer wiring substrate according to one of claims 1 to 4.

6. The multi-layer wiring substrate according to claim 1, wherein the copper foil is provided with a plurality of windows filled with the insulating resin layer.

7. The multi-layer wiring substrate according to claim 1, wherein the plurality of independent conductive paths also perforate through from one side of the multi-layer wiring substrate to the other side thereof.

8. A multi-layer wiring structure, comprising:

a core substrate comprising a copper foil provided with a plurality of windows at a predetermined pitch, an insulation resin layer filled in the windows of said copper foil and covering the copper foil, and a plurality of independent electrically conductive through holes provided in regions where the insulation resin layer fills in the windows of said copper foil, and extending from a front side through a back side of the core substrate in which the electrically conductive through holes are surrounded by the insulation resin layer; and build-up layers formed on opposite sides of the core substrate by stacking insulation layers and wiring layers on respective side of the core substrate.

9. The multi-layer wiring substrate according to claim 8, wherein the core substrate further comprises a chemical copperplating provided to cover the insulation resin layer filled in the windows of said copper foil.

10. The multi-layer wiring substrate according to claim 8, wherein the through holes exhibit a diameter of 0.03 mm and the respective through holes are disposed at the predetermined pitch of 0.1 mm.

11. The multi-layer wiring substrate according to claim 8, wherein the windows of said copper foil are formed using triple harmonic waves and quadruple harmonic waves of a YAG laser beam.

* * * * *